(12) United States Patent
Tam et al.

(10) Patent No.: US 7,760,017 B2
(45) Date of Patent: Jul. 20, 2010

(54) INTEGRATED CIRCUIT HAVING ON DIE STRUCTURE PROVIDING CAPACITANCE IN AMPLIFIER FEEDBACK PATH

(75) Inventors: Kimo Y. F. Tam, Lincoln, MA (US); Stefano D'Aquino, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 17 days.

(21) Appl. No.: 12/107,372

(22) Filed: Apr. 22, 2008

(65) Prior Publication Data

US 2009/0261907 A1    Oct. 22, 2009

(51) Int. Cl.
*H03F 1/00* (2006.01)
(52) U.S. Cl. .................................. 330/68; 330/260
(58) Field of Classification Search ............ 330/68, 330/295, 124 R, 260, 84, 126
See application file for complete search history.

(56) References Cited

U.S. PATENT DOCUMENTS

| 5,798,664 A * | 8/1998 | Nagahori et al. ............. 327/307 |
| 6,160,453 A * | 12/2000 | Feld et al. ..................... 330/289 |
| 7,323,933 B2 * | 1/2008 | Gilbert ......................... 330/254 |

OTHER PUBLICATIONS

D. Johns and K. Martin. Analog Integrated Circuit Design, 1997, pp. 221-303. John Wiley & Sons, Inc. ISBN 0-471-14448-7.

Gray and Meyer, Frequency Response and Stability of Feedback Amplifiers, pp. 567-570, ISBN 0-471-87493-0.

* cited by examiner

*Primary Examiner*—Henry K Choe
(74) *Attorney, Agent, or Firm*—Kenyon & Kenyon LLP

(57) ABSTRACT

An amplifier structure includes shield conductors that are provided spatially adjacent to elongated feedback signal lines that couple a feedback circuit to an amplifier input. The shield conductors are provided between the feedback signal lines and a ground plane, which interrupts a parasitic capacitance that otherwise would be established between the feedback signal line and ground. The shield conductors are electrically coupled to the amplifier's outputs which create a capacitance between the output terminal and the feedback signal line. In some embodiments, the capacitance generated between the output terminal and the feedback signal line can suffice as a capacitor in a feedback path of the amplifier and be contained in an integrated circuit die on which the amplifier is manufactured. Optionally, a structure may be provided that eliminates common mode signals on the feedback lines while simultaneously preserving the common mode signals on the amplifier output terminals. In this option, a second amplifier is provided that, in response to common mode variations at the output terminal, generates counterbalancing voltage variations on a second circuit that is coupled to the feedback lines at their source. The two variations cancel each other out at nodes from which the feedback lines originate, which substantially reduces feedback common mode variation even when there is common mode variation at the output terminals.

20 Claims, 5 Drawing Sheets

100

100

200

400

500

600

700

INTEGRATED CIRCUIT HAVING ON DIE STRUCTURE PROVIDING CAPACITANCE IN AMPLIFIER FEEDBACK PATH

BACKGROUND

Crosspoint switches are commercially available products that selectively route a plurality of input signals to a plurality of output terminals (for example, J inputs to K outputs), where each output is connected to at most a single input signal. Their usefulness arises from the need to connect source signals (video and audio, for example) to multiple loads (video monitors, for example), where the connectivity matrix can be conveniently reprogrammed via a digital interface.

Crosspoint switches may be manufactured as integrated circuits. Crosspoint die size has increased steadily with products that provide increasingly larger input and output counts. For example, at the time of this writing, 32×32 or 48×27 crosspoints are commercially available. Larger die sizes have led to larger parasitics capacitances within circuit components which can limit a switch's dynamic performance. Two such limiting factors are the sheer length of each signal line within each slice—the length of the wires themselves—and the number of circuit elements connected to them. Parasitic capacitance, unless remedied, limits the size and performance of crosspoint switches.

FIG. 7 is a circuit diagram that illustrates the effects of parasitic capacitance in an amplifier circuit that includes an operational amplifier 710 in a non-inverting configuration. There, the circuit 700 may include an input signal coupled to a positive input terminal and a feedback circuit coupling to the output terminal, the negative input terminal and ground. Consider first a circumstance where the feedback circuit includes resistors $R_F$ and $R_G$. When the operational amplifier 710 is manufactured as an integrated circuit, parasitic capacitances commonly are created between the negative input terminal and ground due to effects created by circuit packaging and layout. FIG. 7 models this parasitic capacitance as $C_{PAR}$. Excess parasitic capacitance can cause problems with ringing in response to a time-varying input signal, poor settling times and, in extreme cases, oscillatory behavior. FIG. 7 also illustrates a feedback capacitor provided between the output terminal and the negative input terminal which combats the effects of parasitic capacitance. The feedback capacitor combats phase delays that might be introduced by the parasitic capacitance and, therefore, remedies performance problems associated with the ringing, settling times and oscillation. As noted, however, the feedback capacitor is a discrete element, which is provided as an external component. A multi-output crosspoint switch will have many such amplifiers and, therefore, would need many feedback capacitors.

There is a need in the art for a crosspoint switch design that minimizes parasitic capacitance of circuit components. Further, there is a need for a crosspoint switch design that reduces or eliminates the need for external feedback capacitors in their design.

BRIEF DESCRIPTION OF THE DRAWINGS

FIG. 1 (b) shows spatial relationships among some of the components of FIG. 1(a) when the circuit is fabricated as an integrated circuit.

DETAILED DESCRIPTION

Embodiments of the present invention provide an amplifier structure that includes shield conductors that are provided spatially adjacent to elongated feedback signal lines that couple a feedback circuit to an amplifier input. The shield conductors are provided between the feedback signal lines and a ground plane, which interrupts a parasitic capacitance that otherwise would be established between the feedback signal line and ground. The shield conductors are electrically coupled to the amplifier's outputs which create a capacitance between the output terminal and the feedback signal line. In some embodiments, the capacitance generated between the output terminal and the feedback signal line can suffice as a capacitor in a feedback path of the amplifier and be contained in an integrated circuit die on which the amplifier is manufactured.

Another embodiment of the present invention provides a structure that eliminates common mode signals on the feedback lines while simultaneously preserving the common mode signals on the amplifier output terminals. In this embodiment, a second amplifier is provided that, in response to common mode variations at the output terminals, generates counterbalancing voltage variations on a second circuit that is coupled to the feedback lines at their source. The two variations cancel each other out at nodes from which the feedback lines originate, which substantially reduces common mode variation even when there is common mode variation at the output terminals.

Figure 1:
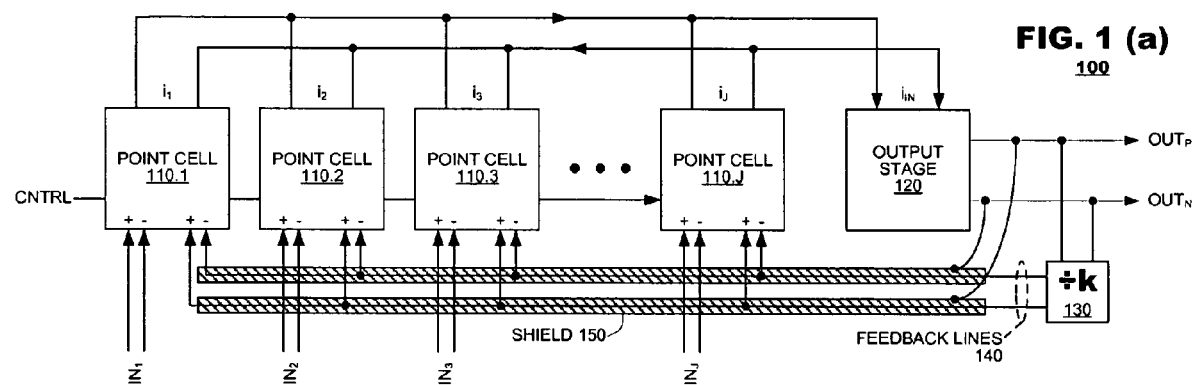
FIG. 1 (a) is a diagram of a slice for a crosspoint switch according to a first embodiment of the present invention.
Figure 1:
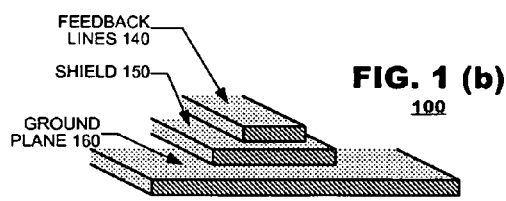

FIG. 1 is a block diagram of a slice 100 according to an embodiment of the present invention. The slice 100 may find application in a crosspoint switch as described above and may be replicated for as many output ports as are provided for the crosspoint switch. As illustrated the slice 100 may include a plurality of point cells 110.1-110.J, an output stage 120 and a feedback circuit 130. The point cells 110.1-110.J each receive a respective input signal ($IN_1$-$IN_J$) on a first input port and a common feedback signal via feedback lines 140. The example of FIG. 1 (a) finds application in a system that carries information as differential voltages and therefore each port includes a pair of input lines. At most one point cell (say, cell 110.2) is active within the slice 100. Selection is controlled by a control line CNTRL. The active point cell 110.2 generates a differential current ($i_2$) to the output stage 120. The output stage generates a differential output signal OUT (shown as $OUT_P$, $OUT_N$) on differential output terminals in response to the differential current. The output signal also is input to the feedback circuit 130, which generates the feedback signal and outputs it to the point cells 110.1-110.J via feedback lines 140.

The slice 100 also includes a metallic shield 150 that is electrically connected to the output terminals. When the slice 100 is manufactured as an integrated circuit, the shield 150 may be spatially co-located with the feedback lines 140. FIG. 1(b) is a schematic illustration of a single feedback line 140 and its associated shield 150 as it may relate to a ground plane 160 of the integrated circuit. The shield 150 interrupts a capacitance that might otherwise have been established between the feedback line 140 and the ground plane 160 and instead builds capacitance between the feedback line 140 and the output terminal.

Figure 2:
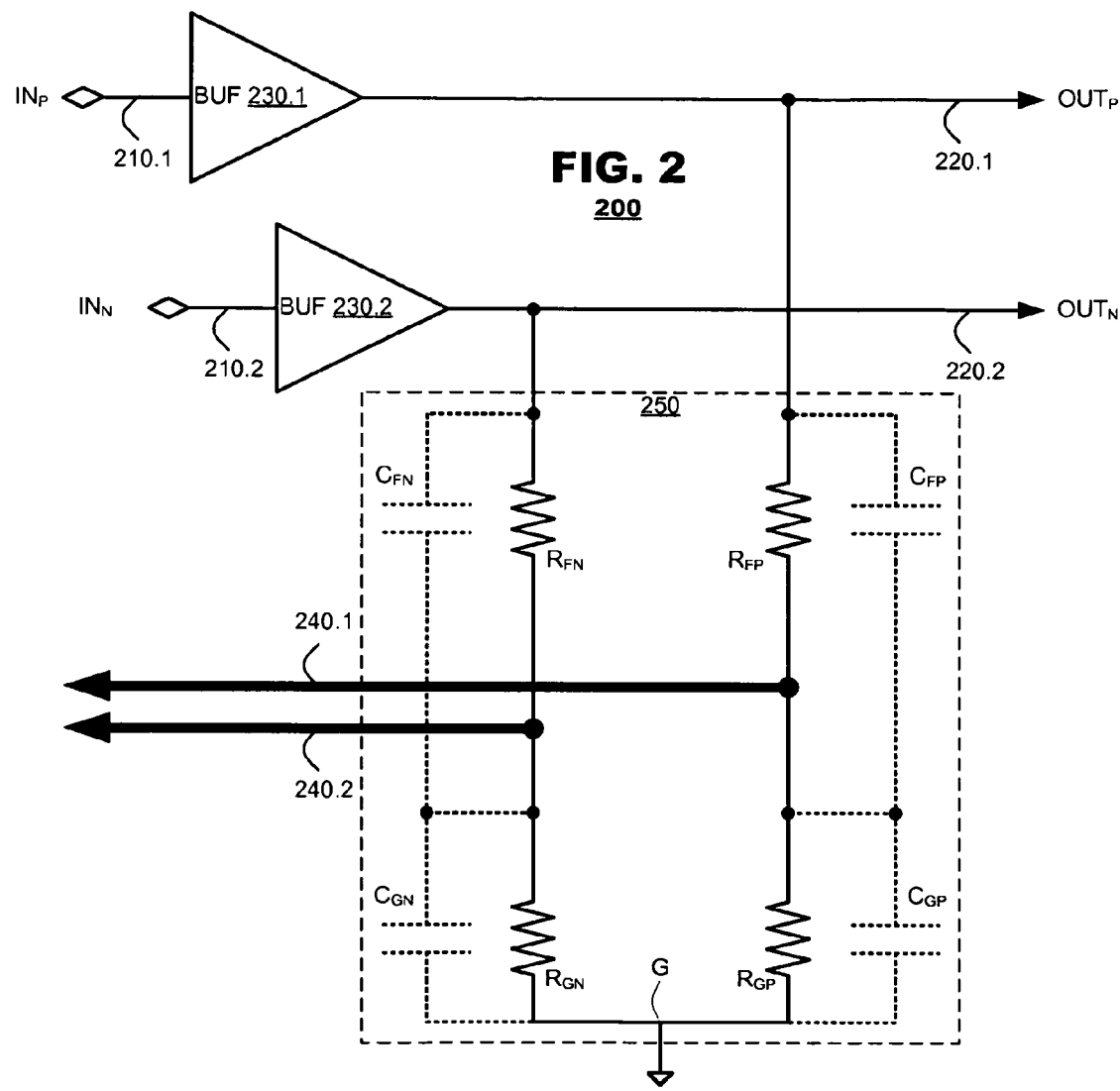
FIG. 2 is a circuit diagram of an output stage according to an embodiment of the present invention.

FIG. 2 is a diagram of an output stage 200 and feedback circuit 250 according to an embodiment of the present invention. There, the output stage 200 includes input terminals 210.1, 210.2 and output terminals 220.1, 220.2 interconnected via buffers 230.1, 230.2. The input terminals 210.1, 210.2 receive differential voltages in response to the differential currents output by the active point cell (FIG. 1). The buffers 230.1, 230.2 generate a differential voltage on the output terminals 220.1, 220.2 in response to the differential input.

The feedback circuit 250 may include a pair of resistor dividers extending from respective outputs 220.1, 220.2 to ground. The resistor dividers each comprise a resistor pair (e.g., $R_{FN}$ and $R_{GN}$, $R_{FP}$ and $R_{GP}$). Intermediate nodes in each of the resistor pair are coupled to respective feedback lines 240.1, 240.2 which are output from the feedback circuit 250 to the point cells (FIG. 1). As noted, the shields (FIG. 1) generate a capacitance between the output terminals 220.1, 220.2 and the respective feedback lines 240.1, 240.2, which is modeled in FIG. 2 as capacitance $C_{FN}$, $C_{FP}$ respectively. Further, when the circuit of FIG. 2 is manufactured in an integrated circuit, parasitic effects may generate capacitances across the resistors $R_{GP}$, $R_{GN}$; these capacitances are modeled as $C_{GP}$ and $C_{GN}$ respectively.

Figure 7:
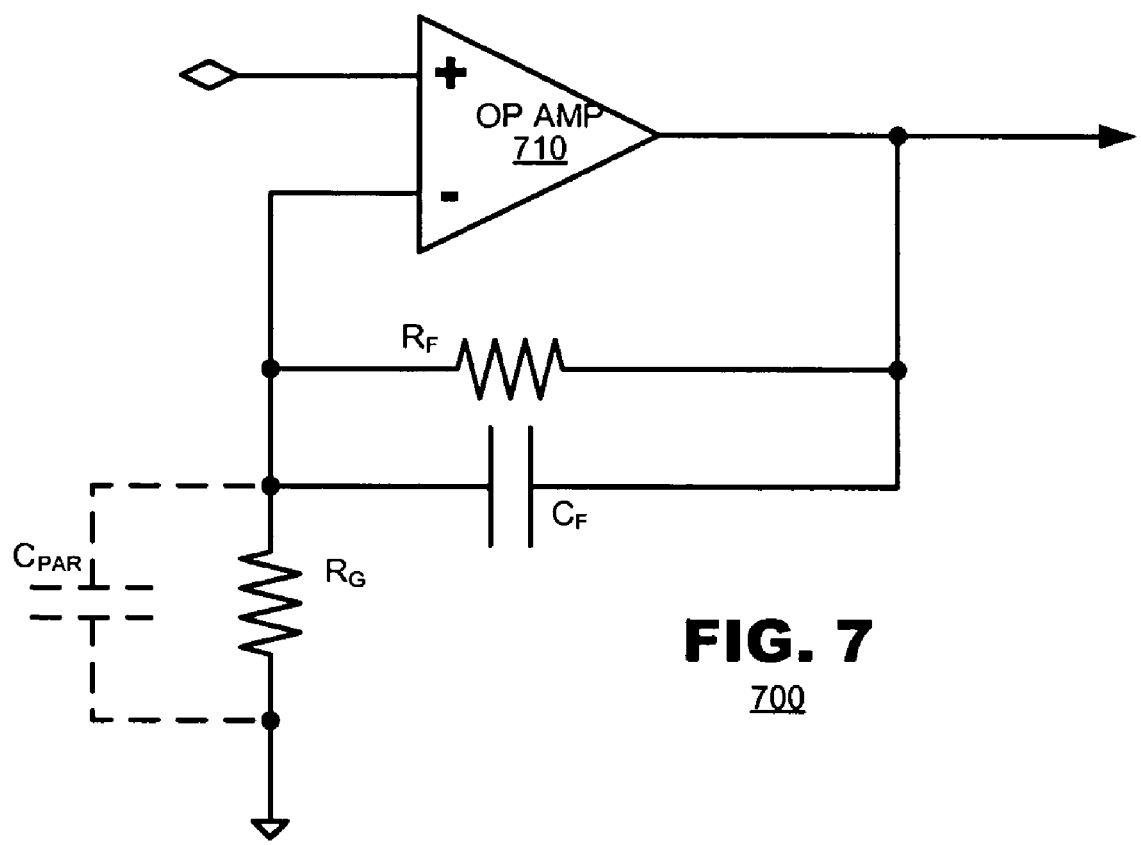
FIG. 7 is a diagram of an operational amplifier.

The structure of FIGS. 1, 2 operates in a manner that resembles the structure of FIG. 7 above. The resistors and capacitances operate in the feedback path of an amplifier and contribute to a transfer function from the selected input (say, $IN_2$) of the slice 100 to the output of the output stage 200 (FIG. 2). Whereas the feedback capacitance of the FIG. 7 model is provided as a component external to an integrated circuit, the shields 150 of the present invention are provided within the integrated circuit. Additionally, the shields 150 reduce the effects of parasitic capacitances that otherwise would be generated between the feedback lines 140 and the ground plane of an integrated circuit. Therefore, it improves the ratio of $C_{PAR}$ to $C_F$ in the model of FIG. 7 (modeled in FIG. 2 as $C_{GP}$, $C_{GN}$ and $C_{FP}$, $C_{FN}$ respectively).

It is believed that, in some design implementations, it may be possible to omit external coupling capacitors and build a crosspoint switch solely from the capacitances developed by the shields. Omission of external feedback capacitors will not occur in all designs.

Figure 3:
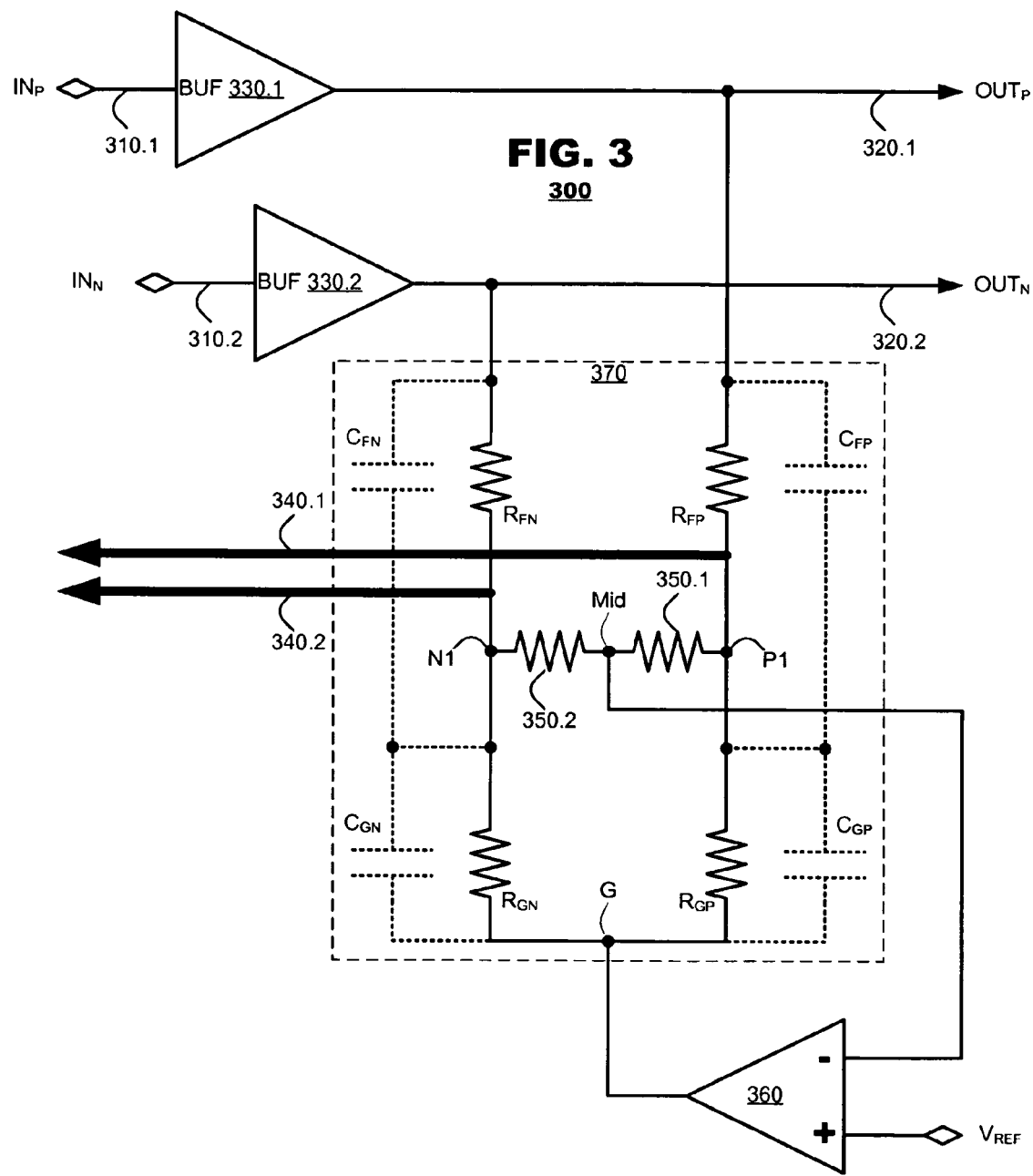
FIG. 3 is a circuit diagram of an output stage according to another embodiment of the present invention.

FIG. 3 is a diagram of an output stage 300 and feedback circuit 370 according to another embodiment of the present invention. There, the output stage 300 includes input terminals 310.1, 310.2 and output terminals 320.1, 320.2 interconnected via buffers 330.1, 330.2. The input terminals 310.1, 310.2 receive differential voltages in response to the differential currents output by the active point cell (FIG. 1). The buffers 330.1, 330.2 generate a differential voltage on the output terminals 320.1, 320.2 in response to the differential input.

The feedback circuit 370 may include a pair of resistor dividers extending from respective outputs 320.1, 320.2 to an intermediate node G. The resistor dividers each comprise a resistor pair (e.g., $R_{FN}$ and $R_{GN}$, $R_{FP}$ and $R_{GP}$). Intermediate nodes P1, N1 in each of the resistor pairs are coupled to respective feedback lines 340.1, 340.2 which are output from the feedback circuit 370 to the point cells (FIG. 1). As noted, the shields (FIG. 1) generate a capacitance between the output terminals 320.1, 320.2 and the respective feedback lines 340.1, 340.2, which is modeled in FIG. 3 as capacitance $C_{FN}$, $C_{FP}$ respectively. Further, when the circuit of FIG. 3 is manufactured in an integrated circuit, parasitic effects may generate capacitances across the resistors $R_{GP}$, $R_{GN}$; these capacitances are modeled as $C_{GP}$ and $C_{GN}$ respectively.

The feedback circuit 370 further may include a pair of bridging resistors 350.1, 350.2 extending between the nodes $P_1$ and $N_1$. An intermediate node Mid between the bridging resistors 350.1, 350.2 may be coupled to a first input of an amplifier 360. A second input of the amplifier may be coupled to a predetermined reference potential $V_{REF}$. An output of the amplifier 360 may be coupled to node G.

During operation, variation in input signals presented at the slice (FIG. 1) may cause variations in both common mode and differential mode components of the output voltage. A common mode signal is one that causes a common variation in the voltage levels at both the $OUT_P$ and $OUT_N$ outputs of the output stage 300. A differential mode signal is one that causes proportional and opposite variations among the voltage levels at the two outputs $OUT_P$ and $OUT_N$. In the embodiment of FIG. 3, differential mode signals should cause equal and opposition changes at nodes $P_1$ and $N_1$, which should cause minimal variation at node Mid. Common mode signals, however, should create identical voltage changes at both nodes $P_1$ and $N_1$, which also causes a variation at node Mid. This common mode variation, therefore, is fed to amplifier 360 which compares it to the reference potential and generates an output at node G.

In an embodiment, the circuit may be tuned such that common mode variations at the output OUT cause counter-balanced variation at node G such that common mode variation at node $P_1$ and $N_1$ is minimized. For example, in an embodiment where resistors $R_{FP}$, $R_{FN}$, $R_{GP}$ and $R_{GN}$ have common resistance values, amplifier 360 may be configured to generate an output voltage that is equal and opposite to the common mode voltage presented at the output OUT. If the common mode voltage at the output OUT increases by ½ volt, for example, the amplifier 360 would decrease the voltage at node G also by ½ volt. These counterbalanced variations prevent common mode variations in the output signal from appearing at the feedback lines.

Several designs of point cells are available in the art. Some point cell designs are generally insensitive to changes in common mode voltage but others are sensitive to such change. The point cell designs that are sensitive to common mode voltage may posses properties that are advantageous for certain designs. The embodiment of FIG. 3 is advantageous, therefore, because it suppresses common mode signals on the feedback lines 340.1, 340.2 but preserves the common mode signals at the output OUT.

Figure 4:
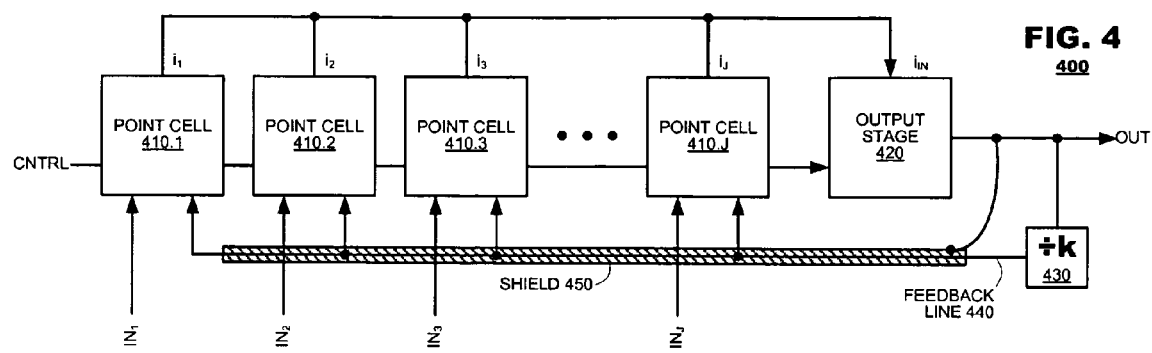
FIG. 4 is a diagram of a slice for a crosspoint switch according to another embodiment of the present invention.

FIG. 4 illustrates a slice 400 according to another embodiment of the invention. This embodiment finds application with single-ended signals, where input signals are presented on a single input line. As illustrated the slice 400 may include a plurality of point cells 410.1-410.J, an output stage 420 and a feedback circuit 430. The point cells 410.1-410.J each receive a respective input signal ($IN_1$-$IN_J$) on a first input port and a common feedback signal via feedback line 440. Only one point cell (say, cell 410.2) is active within the slice 400. Selection is controlled by a control line CNTRL. The active point cell 410.2 generates an output current ($i_2$) to the output stage 420. The output stage generates an output signal OUT on an output terminal in response to the current output from the active point cell 410.2. The output signal also is input to the feedback circuit 430, which generates the feedback signal and outputs it to the point cells 410.1-410.J via a feedback line 440.

The slice 400 also includes a metallic shield 450 that is electrically connected to the output terminal. When the slice 400 is manufactured as an integrated circuit, the shield 450 may be spatially co-located with the feedback line 440. The shield 450 interrupts a capacitance that might otherwise have been established between the feedback line 440 and a ground plane and instead builds capacitance between the feedback line 440 and the output terminal.

Figure 5:
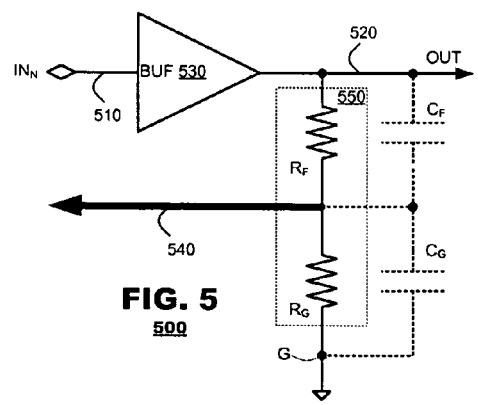
FIG. 5 is a circuit diagram of an output stage according to an embodiment of the present invention.

FIG. 5 is a diagram of an output stage 500 and feedback circuit 550 according to an embodiment of the present invention. There, the output stage 500 includes an input terminal 510 and an output terminal 520 interconnected via a buffer 530. The input terminal 510 receives an input voltage in response to current output by the active point cell (FIG. 4). The buffer 530 generates an output voltage on the output terminal 520 in response to the input voltage.

The feedback circuit 550 may include a resistor divider extending from the output 520 to ground. The resistor divider comprises a pair of resistors $R_F$ and $R_G$. An intermediate node in the resistor divider may be coupled to a feedback line 540 which is output from the feedback circuit 550 to the point cells (FIG. 4). As noted, the shield 450 (FIG. 4) generates a capacitance between the output terminal 520 and the feedback line 540, which is modeled in FIG. 5 as capacitance $C_F$. Further, when the circuit of FIG. 5 is manufactured in an integrated circuit, parasitic effects may generate capacitance across the resistor $R_G$, which is modeled as $C_G$ in FIG. 5.

The structure of FIGS. 4, 5 operates in a manner that resembles the structure of FIG. 7 above. The resistors and capacitances operate in the feedback path of an amplifier and contribute to a transfer function from the selected input (say, $IN_2$) of the slice 400 to the output of the output stage (FIG. 5). Whereas the feedback capacitance of the FIG. 7 model is provided as a component external to an integrated circuit, the shield 450 of the present invention is provided within the integrated circuit. Additionally, the shield 450 reduces the effects of parasitic capacitances that otherwise would be generated between the feedback line 440 and the ground plane of an integrated circuit. Therefore, it improves the ratio of $C_{PAR}$ to $C_F$ in the model of FIG. 7 (modeled in FIG. 5 as $C_G$ and $C_F$).

Accordingly, the principles of the present invention find application in both differential mode circuits (FIGS. 1, 2) and single ended circuits (FIGS. 4, 5).

Figure 6:
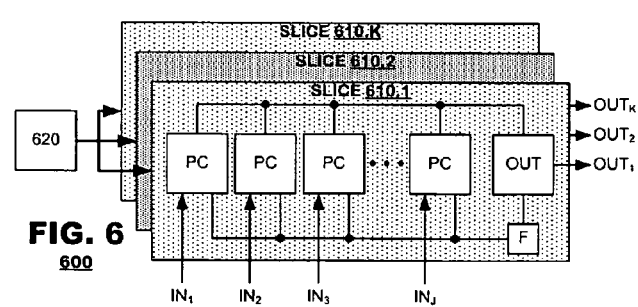
FIG. 6 is a simplified circuit diagram of a crosspoint switch according to an embodiment of the present invention.

FIG. 6 is a simplified block diagram of a crosspoint switch 600 according to an embodiment of the present invention. As indicated, a crosspoint switch 600 selectively routes a plurality of input signals to a plurality of output terminals (for example, J inputs to K outputs), where each output is connected to at most a single input signal. The foregoing embodiments of the present invention permit the slices described in the preceding figures to be duplicated as necessary to provide for the K outputs of the switch. They are shown generally as slices 610.1-610.K in FIG. 6 and may be provided according to either the differential voltage or single-ended voltage architectures. The slices 610.1-610.K themselves may have as many point cells as are needed to accommodate the J inputs of the switch. A common controller 620 may control operation of the respective slices to determine which input signals are propagated to the respective outputs.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A crosspoint switch, comprising:
a plurality of slices, each comprising:
input circuits corresponding to respective input signals,
an output stage to generate output signals of the respective slice, and
a feedback circuit, coupled to the output stage and coupled to each of the input circuits via a feedback line,
a shield conductor, electrically coupled to the output stage and having a length and location that spatially coincides with a length of the feedback line.

2. The crosspoint switch of claim 1, wherein the input signals and output signals are differential signals.

3. The crosspoint switch of claim 2, wherein the slice includes a pair of shield conductors, a first conductor coupled to a positive output of the output stage and spatially coinciding with a length of a positive feedback line and a second conductor coupled to a negative output of the output stage and spatially coinciding with a length of a negative feedback line.

4. The crosspoint switch of claim 3, further comprising means to inhibit common mode variations at origins of the positive and negative feedback lines when common mode variations occur at the positive and negative outputs of the output stage.

5. The crosspoint switch of claim 4, wherein the input circuits are common mode sensitive point cell circuits.

6. The crosspoint switch of claim 3, wherein the input circuits are common mode insensitive point cell circuits.

7. The crosspoint switch of claim 1, wherein the input signals and output signals are single-ended signals.

8. The crosspoint switch of claim 1, wherein at most one input circuit of the slice is active as determined by a control signal to the slice.

9. The crosspoint switch of claim 1, wherein the input circuits are point cell circuits.

10. An amplifier feedback circuit comprising:
a pair of resistors arranged as a voltage divider, the voltage divider coupled to an amplifier output at a first node thereof,
a feedback signal line connecting an input terminal of the amplifier to a center node of the voltage divider across a connection distance,
a shield conductor, electrically connected to the output amplifier and having a shield length that overlaps the feedback signal line to develop a feedback capacitance between the output terminal and the input terminal,
wherein the amplifier, the voltage divider, the feedback signal line and the shield conductor are provided in a common integrated circuit.

11. The feedback circuit of claim 10, wherein a portion of the shield conductor is provided between the feedback signal line and a ground plane to reduce parasitic capacitance established between the feedback signal line and the ground plane.

12. The feedback circuit of claim 11, wherein the feedback capacitance is provided in parallel with a first of the resistors extending from the amplifier output to the center node, and the parasitic capacitance is provided in parallel between the center node and ground.

13. The feedback circuit of claim 10, wherein the feedback signal line is input to multiple point cells of a crosspoint switch.

14. An amplifier feedback circuit comprising:
a pair of input terminals for a differential input signal,
a pair of output terminals for a differential output signal,
a feedback circuit comprising a pair of feedback paths, each feedback path comprising a resistor divider circuit coupled to respective output terminal, the pair of resistor divider circuits coupled to a common node, a pair of feedback signal lines, each coupled to an intermediate node of a respective one of the resistor divider circuits, and a pair of shield conductors, each electrically coupled to a respective output terminal and having a shield length that overlaps a respective feedback signal line to develop a feedback capacitance between the respective output terminal and respective feedback signal line.

15. The amplifier feedback circuit of claim 14, wherein the common node is ground.

16. The amplifier feedback circuit of claim 14, further comprising
a resistor bridge coupling the intermediate nodes of the two resistor divider circuits to each other, and
a differential amplifier having a first input coupled to another intermediate node of the resistor bridge, having a second input coupled to a reference potential and having an output coupled to the common node.

17. The feedback circuit of claim 14, wherein portions of the shield conductors are provided between the respective feedback signal line and a ground plane to reduce parasitic capacitance established between the respective feedback signal line and the ground plane.

18. The feedback circuit of claim 17, wherein within each feedback path the feedback capacitance is provided in parallel with a first of the resistors extending from the amplifier output to the intermediate node, and the parasitic capacitance is provided in parallel between the intermediate node and the common node.

19. The feedback circuit of claim 14, wherein the feedback signal lines are input to multiple point cells of a crosspoint switch.

20. A signal propagation method, comprising:

responsive to variations of a differential output voltage signal, identifying a common mode component of the output voltage signal, comparing the common mode component to a reference voltage, responsive to a difference between the common mode component and the reference voltage, generating a counterbalancing voltage, and generating a differential feedback signal from the differential output voltage signal and the counterbalancing voltage, wherein the counterbalancing voltage reduces variations of the common mode component of the differential output voltage signal on the differential feedback signal but preserves a differential mode component of the differential output voltage signal on the differential feedback signal.

* * * * *